(12) United States Patent
Hong et al.

(10) Patent No.: US 11,764,207 B2
(45) Date of Patent: Sep. 19, 2023

(54) DIODE STRUCTURES OF STACKED DEVICES AND METHODS OF FORMING THE SAME

(71) Applicant: Samsung Electronics Co., Ltd., Suwon-si (KR)

(72) Inventors: Byounghak Hong, Albany, NY (US); Seungchan Yun, Waterford, NY (US); Kang-ill Seo, Albany, NY (US)

(73) Assignee: Samsung Electronics Co., Ltd., Suwon-si (KR)

( * ) Notice: Subject to any disclaimer, the term of this patent is extended or adjusted under 35 U.S.C. 154(b) by 52 days.

(21) Appl. No.: 17/554,171

(22) Filed: Dec. 17, 2021

(65) Prior Publication Data

US 2023/0092061 A1    Mar. 23, 2023

Related U.S. Application Data

(60) Provisional application No. 63/246,965, filed on Sep. 22, 2021.

(51) Int. Cl.
*H01L 27/02* (2006.01)
*H01L 27/07* (2006.01)
(Continued)

(52) U.S. Cl.
CPC .. *H01L 27/0255* (2013.01); *H01L 21/823807* (2013.01); *H01L 21/823885* (2013.01);
(Continued)

(58) Field of Classification Search
CPC ......... H01L 27/0255; H01L 21/823807; H01L 21/823885; H01L 27/0727; H01L 29/7391;
(Continued)

(56) References Cited

U.S. PATENT DOCUMENTS 9,431,388 B1   8/2016 Gauthier et al.
10,629,538 B2  4/2020 Zhang
(Continued)

OTHER PUBLICATIONS

Partial European Search Report corresponding to EP Patent Application No. 22194108.1, dated Feb. 8, 2023 (18 pages).
(Continued)

*Primary Examiner* — David Vu
(74) *Attorney, Agent, or Firm* — Myers Bigel, P.A.

(57) ABSTRACT

Diode structures of stacked devices and methods of forming the same are provided. Diode structures may include a substrate, an upper semiconductor layer that is spaced apart from the substrate in a vertical direction, an upper thin semiconductor layer protruding from a side surface of the upper semiconductor layer in a first horizontal direction, a lower semiconductor layer that is between the substrate and the upper semiconductor layer and has a first conductivity type, a lower thin semiconductor layer protruding from a side surface of the lower semiconductor layer in the first horizontal direction, a first diode contact that is electrically connected to the lower semiconductor layer, and a second diode contact that is electrically connected to one of the upper semiconductor layer and a portion of the substrate. The one of the upper semiconductor layer and the portion of the substrate may have a second conductivity type.

20 Claims, 23 Drawing Sheets

(51) Int. Cl.
    *H01L 29/861*     (2006.01)
    *H01L 21/8238*     (2006.01)
    *H01L 29/739*     (2006.01)

(52) U.S. Cl.
    CPC ...... *H01L 27/0727* (2013.01); *H01L 29/7391* (2013.01); *H01L 29/861* (2013.01)

(58) Field of Classification Search
    CPC . H01L 29/861; H01L 27/0688; H01L 27/092; H01L 29/775; H01L 27/0629; H01L 29/0657; H01L 29/66136; H01L 29/868
    See application file for complete search history.

(56) References Cited

U.S. PATENT DOCUMENTS

| | | |
|---|---|---|
| 10,937,903 B2 | 3/2021 | Balakrishnan et al. |
| 2007/0023866 A1 | 2/2007 | Chatty et al. |
| 2011/0300686 A1 | 12/2011 | Chae et al. |
| 2016/0211264 A1 | 7/2016 | Peng |
| 2018/0315838 A1 | 11/2018 | Morrow et al. |
| 2019/0081032 A1 | 3/2019 | Okubo |
| 2020/0211905 A1 | 7/2020 | Huang et al. |
| 2020/0258881 A1 | 8/2020 | Lilak et al. |

OTHER PUBLICATIONS

Extended European Search Report corresponding to EP Application No. 22194108.1, dated May 10, 2023 (17 pages).

DIODE STRUCTURES OF STACKED DEVICES AND METHODS OF FORMING THE SAME

CROSS-REFERENCE TO RELATED APPLICATION

This application claims priority to U.S. Provisional Application Ser. No. 63/246,965, entitled DIODE DEVICES FOR 3D STACKED STRUCTURES, filed in the USPTO on Sep. 22, 2021, the disclosure of which is hereby incorporated by reference herein in its entirety.

FIELD

The present disclosure generally relates to the field of electronics and, more particularly, to integrated circuit devices including stacked transistors.

BACKGROUND

Integrated circuit devices including stacked transistors, such as a complementary field effect transistor (CFET) stack, were introduced to reduce their area, thereby increasing the integration density. Integrated circuit devices may also include diodes for various applications such as voltage regulation or electrostatic discharge (ESD) protection.

SUMMARY

According to some embodiments of the present invention, diode structures may include a substrate, an upper semiconductor layer that is spaced apart from the substrate in a vertical direction, an upper thin semiconductor layer protruding from a side surface of the upper semiconductor layer in a first horizontal direction, a lower semiconductor layer that is between the substrate and the upper semiconductor layer and has a first conductivity type, a lower thin semiconductor layer protruding from a side surface of the lower semiconductor layer in the first horizontal direction, a first diode contact that is electrically connected to the lower semiconductor layer, and a second diode contact that is electrically connected to one of the upper semiconductor layer and a portion of the substrate. The one of the upper semiconductor layer and the portion of the substrate may have a second conductivity type.

According to some embodiments of the present invention, integrated circuit device may include a diode structure. The diode structure may include an upper semiconductor layer on a substrate, an upper thin semiconductor layer protruding from the upper semiconductor layer, a lower semiconductor layer that is between the substrate and the upper semiconductor layer, a lower thin semiconductor layer protruding from the lower semiconductor layer, a first diode contact that is electrically connected to the lower semiconductor layer or a first portion of the substrate, and a second diode contact that is electrically connected to the upper semiconductor layer or a second portion of the substrate.

According to some embodiments of the present invention, methods of forming an integrated circuit device may include forming a lower thin semiconductor layer on a substrate, forming a lower semiconductor layer contacting a side surface of the lower thin semiconductor layer, forming an upper thin semiconductor layer, forming an upper semiconductor layer contacting a side surface of the upper thin semiconductor layer, forming a first diode contact that is electrically connected to the lower semiconductor layer or a first portion of the substrate, and forming a second diode contact that is electrically connected to the upper semiconductor layer or a second portion of the substrate.

DETAILED DESCRIPTION

According to some embodiments of the present invention, diode structures may include a vertical diode that includes two semiconductor layers stacked in a vertical direction. The diode structures may be formed by vertical integration. In some embodiments, elements of diode structures may be formed concurrently with elements (e.g., an active layer, a gate electrode, and/or a source/drain region) of stacked transistors of standard cells. In some embodiments, diode contacts may be formed by processes performed on a front side of a substrate. In some embodiments, at least one of diode contacts may be formed by processes (e.g., processes of forming a buried power rail (BPR) processes) performed on a backside of a substrate. As used herein the term "and/or" includes any and all combinations of one or more of the associated listed items. Further, as used herein, "formed concurrently" refers to being formed by the same fabrication process(es), at approximately (but not necessarily exactly) the same time.

Diode structures and methods of forming the same pursuant to embodiments of the present invention can simplify manufacturing processes of an integrated circuit device that includes both diode structures and stacked transistors, as common manufacturing processes can be used to form both elements of those diodes and elements of the stacked transistors.

Figure 1:
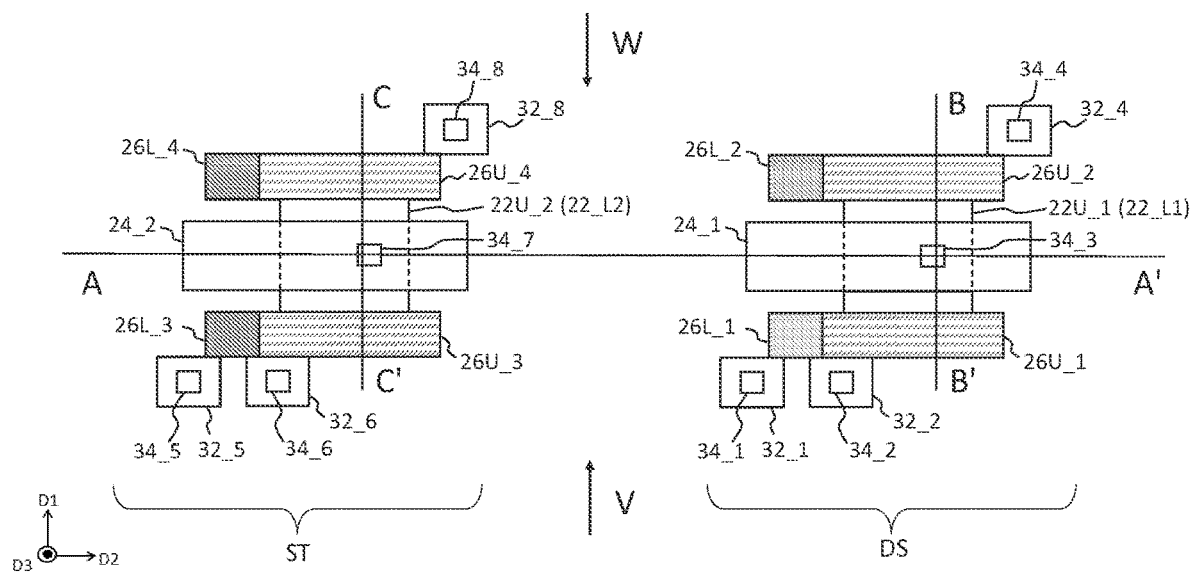
FIG. 1 is a plan view of an integrated circuit device according to some embodiments of the present invention.
Figure 2:
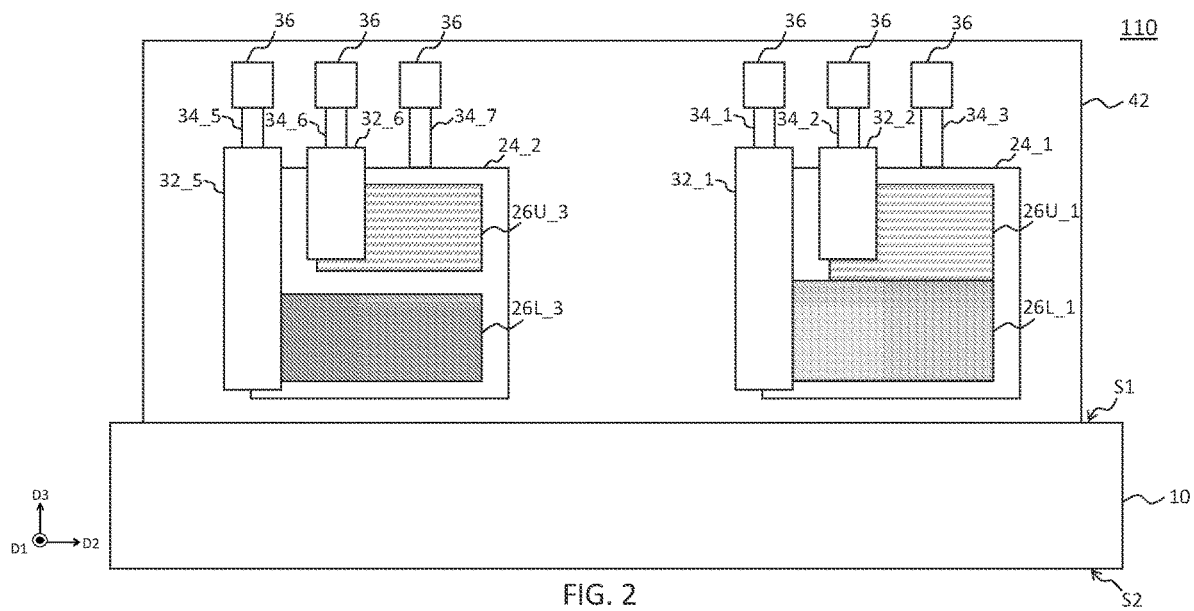
FIGS. 2 and 3 are side views of an integrated circuit device from viewpoints V and W in FIG. 1, respectively, according to some embodiments of the present invention.
Figure 3:
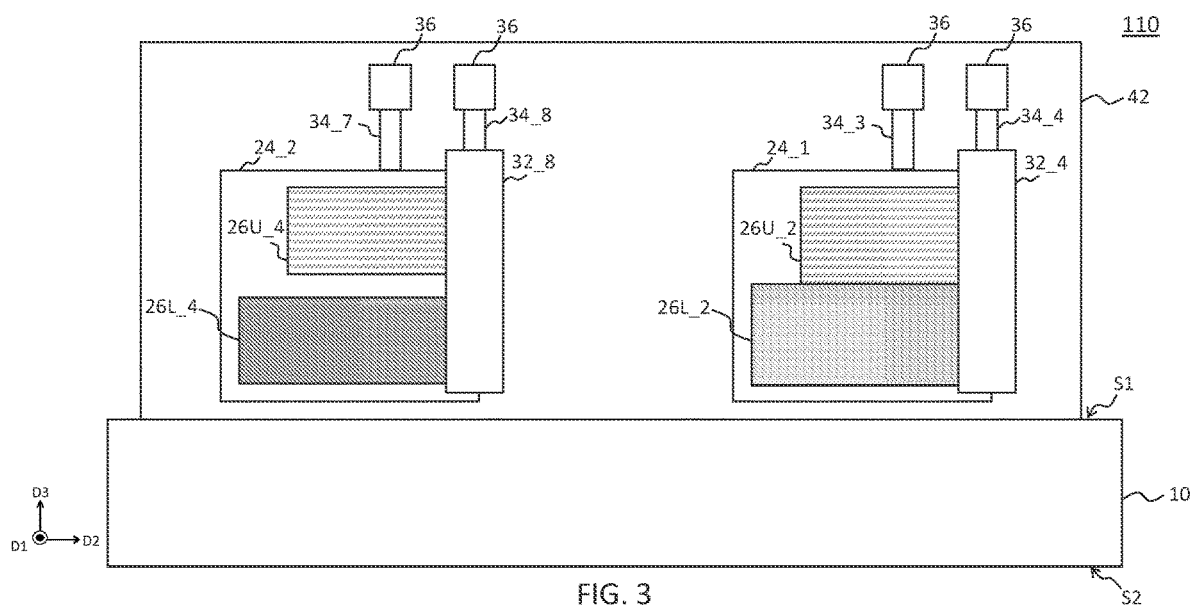
Figure 4:
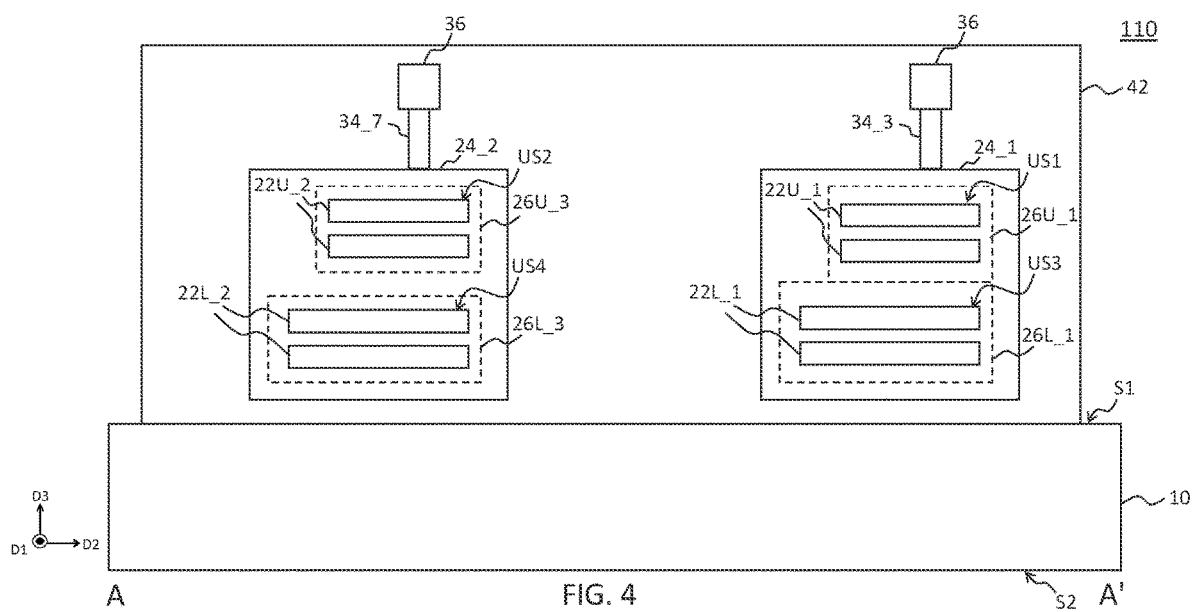
FIGS. 4 and 5 are cross-sectional views of an integrated circuit device taken along the line A-A' and the line B-B' in FIG. 1, respectively, according to some embodiments of the present invention.
Figure 5:
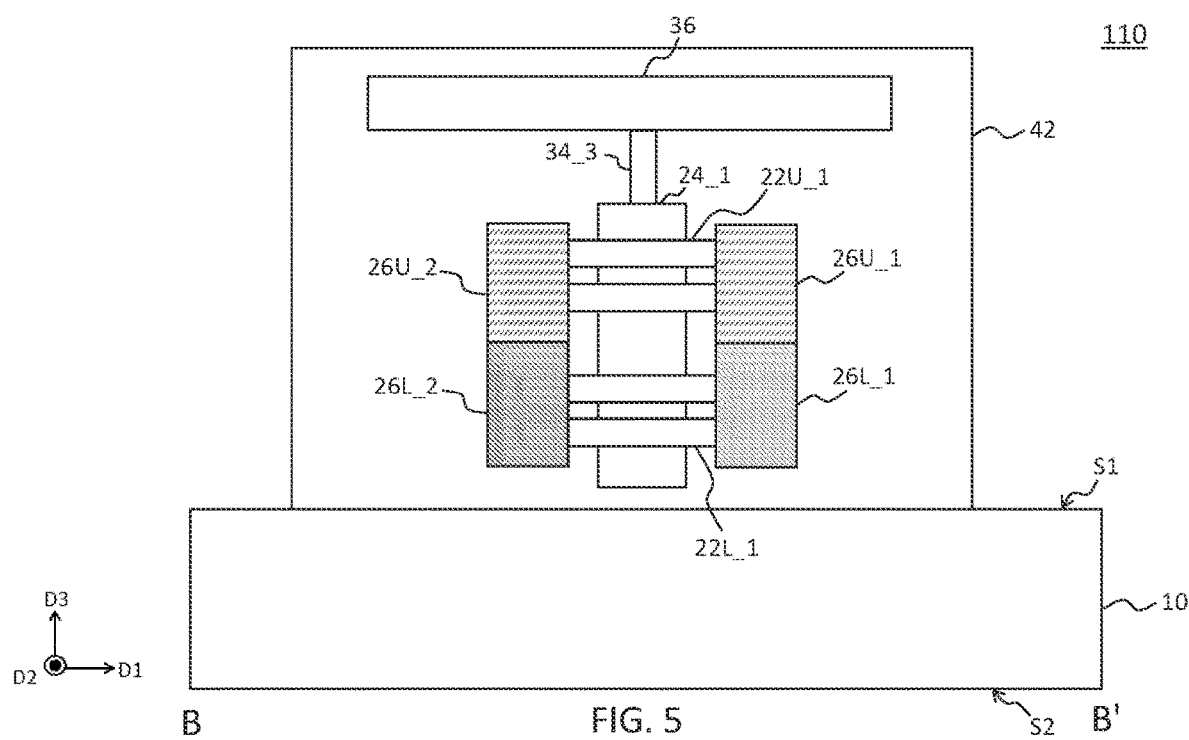

FIG. 1 is a plan view of an integrated circuit device according to some embodiments of the present invention. FIGS. 2 and 3 are side views of an integrated circuit device 110 from viewpoints V and W in FIG. 1, respectively, according to some embodiments of the present invention. FIGS. 4 and 5 are cross-sectional views of the integrated circuit device 110 taken along the line A-A' and the line B-B' in FIG. 1, respectively, according to some embodiments of the present invention.

Referring to FIGS. 1 through 5, the integrated circuit device 110 may include a stacked transistor structure ST on a substrate 10 and a diode structure DS. The substrate 10 may include a first surface S1 and a second surface S2. The first surface S1 and the second surface S2 may be opposite and parallel to each other. The first surface 51 may be a front side of the substrate 10, and the second surface S2 may be a backside of the substrate 10.

The diode structure DS may include a first lower semiconductor layer 26L_1 and a second lower semiconductor layer 26L_2 that may be spaced apart from the first lower semiconductor layer 26L_1 in a first direction D1. The first direction D1 may be parallel to the first surface S1 and the second surface S2 of the substrate 10 and may be a first horizontal direction. A first lower thin semiconductor layer 22L_1 may be provided between the first lower semiconductor layer 26L_1 and the second lower semiconductor layer 26L_2 and may contact both the first lower semiconductor layer 26L_1 and the second lower semiconductor layer 26L_2. In some embodiments, the first lower thin semiconductor layer 22L_1 may contact side surfaces of the first lower semiconductor layer 26L_1 and the second lower semiconductor layer 26L_2 as illustrated in FIG. 5. The first lower semiconductor layer 26L_1 and the second lower semiconductor layer 26L_2 may have a first conductivity type (e.g., an N-type conductivity or a P-type conductivity).

The diode structure DS may also include a first upper semiconductor layer 26U_1 and a second upper semiconductor layer 26U_2 that may be spaced apart from the first upper semiconductor layer 26U_1 in the first direction D1. A first upper thin semiconductor layer 22U_1 may be provided between the first upper semiconductor layer 26U_1 and the second upper semiconductor layer 26U_2 and may contact both the first upper semiconductor layer 26U_1 and the second upper semiconductor layer 26U_2. In some embodiments, the first upper thin semiconductor layer 22U_1 may contact side surfaces of the first upper semiconductor layer 26U_1 and the second upper semiconductor layer 26U_2 as illustrated in FIG. 5. The first upper semiconductor layer 26U_1 and the second upper semiconductor layer 26U_2 may have a second conductivity type that may be different from the first conductivity type.

The first lower semiconductor layer 26L_1 may contact the first upper semiconductor layer 26U_1, and the first lower semiconductor layer 26L_1 and the first upper semiconductor layer 26U_1 may form a single diode. In some embodiments, an upper surface of the first lower semiconductor layer 26L_1 may contact a lower surface of the first upper semiconductor layer 26U_1 as illustrated in FIG. 2. As used herein, "a lower surface of an element A" (or similar language) means a surface of the element A facing the substrate 10.

A first contact 32_1 that may contact the first lower semiconductor layer 26L_1 and a second contact 32_2 that may contact the first upper semiconductor layer 26U_1 may also be provided. The first contact 32_1 may contact a side surface of the first lower semiconductor layer 26L_1, and the second contact 32_2 may contact a side surface of the first upper semiconductor layer 26U_1 as illustrated in FIG. 1 but the present invention is not limited thereto. For example, the first contact 32_1 may contact an upper surface of the first lower semiconductor layer 26L_1, and the second contact 32_2 may contact an upper surface of the first upper semiconductor layer 26U_1. The first contact 32_1 and the second contact 32_2 may contact portions of the diode, respectively. Accordingly, the first contact 32_1 and the second contact 32_2 may be a first diode contact and a second diode contact, respectively.

The second lower semiconductor layer 26L_2 may contact the second upper semiconductor layer 26U_2. In some embodiments, an upper surface of the second lower semiconductor layer 26L_2 may contact a lower surface of the second upper semiconductor layer 26U_2 as illustrated in FIG. 3. A fourth contact 32_4 that may contact both the second lower semiconductor layer 26L_2 and the second upper semiconductor layer 26U_2 may be provided. In some embodiments, the second lower semiconductor layer 26L_2, the second upper semiconductor layer 26U_2 and the fourth contact 32_4 may be omitted.

In some embodiments, a first metal layer 24_1 may be provided between the first lower semiconductor layer 26L_1 and the second lower semiconductor layer 26L_2 and between the first upper semiconductor layer 26U_1 and the second upper semiconductor layer 26U_2. The first metal layer 24_1 may be spaced apart from the first lower semiconductor layer 26L_1, the second lower semiconductor layer 26L_2, the first upper semiconductor layer 26U_1 and the second upper semiconductor layer 26U_2 as illustrated in FIGS. 1 and 5. A portion of the first lower thin semiconductor layer 22L_1 and a portion of the first upper thin semiconductor layer 22U_1 may be in the first metal layer 24_1 as illustrated in FIGS. 1 and 4. Although not shown, an insulating layer may be provided between the portion of the first lower thin semiconductor layer 22L_1 and the first metal layer 24_1 and between the portion of the first upper thin semiconductor layer 22U_1 and the first metal layer 24_1.

FIG. 1 illustrates that the stacked transistor structure ST is spaced apart from the diode structure DS in a second direction D2, but the present invention is not limited thereto. The second direction D2 may be parallel to the first surface S1 and the second surface S2 of the substrate 10 and may be a second horizontal direction. In some embodiments, the stacked transistor structure ST may be spaced apart from the diode structure DS in the first direction D1 or in a direction that may be different from the first direction D1 and the second direction D2. The first surface S1 and the second surface S2 of the substrate 10 may be spaced apart from each other in a third direction D3 that may be perpendicular to the first surface S1 and the second surface S2 of the substrate 10 and may be a vertical direction.

Still referring to FIGS. 1 through 5, the stacked transistor structure ST may include a third lower semiconductor layer 26L_3 and a fourth lower semiconductor layer 26L_4 that may be spaced apart from the third lower semiconductor layer 26L_3 in the first direction D1. A second lower thin semiconductor layer 22L_2 may be provided between the third lower semiconductor layer 26L_3 and the fourth lower semiconductor layer 26L_4 and may contact both the third lower semiconductor layer 26L_3 and the fourth lower semiconductor layer 26L_4. In some embodiments, the second lower thin semiconductor layer 22L_2 may contact side surfaces of the third lower semiconductor layer 26L_3 and the fourth lower semiconductor layer 26L_4. The third lower semiconductor layer 26L_3 and the fourth lower semiconductor layer 26L_4 may have the first conductivity type (e.g., an N-type conductivity or a P-type conductivity). The second lower thin semiconductor layer 22L_2 may be a lower active layer of a lower transistor, and the third lower semiconductor layer 26L_3 and the fourth lower semiconductor layer 26L_4 may be lower source/drain regions of the lower transistor.

The stacked transistor structure ST may also include a third upper semiconductor layer 26U_3 and a fourth upper semiconductor layer 26U_4 that may be spaced apart from the third upper semiconductor layer 26U_3 in the first direction D1. A second upper thin semiconductor layer 22U_2 may be provided between the third upper semiconductor layer 26U_3 and the fourth upper semiconductor layer 26U_4 and may contact both the third upper semiconductor layer 26U_3 and the fourth upper semiconductor layer 26U_4. In some embodiments, the second upper thin semiconductor layer 22U_2 may contact side surfaces of the third upper semiconductor layer 26U_3 and the fourth upper semiconductor layer 26U_4. The third upper semiconductor layer 26U_3 and the fourth upper semiconductor layer 26U_4 may have the second conductivity type. The second upper thin semiconductor layer 22U_2 may be an upper active layer of an upper transistor, and the third upper semiconductor layer 26U_3 and the fourth upper semiconductor layer 26U_4 may be upper source/drain regions of the upper transistor.

The third lower semiconductor layer 26L_3 and the third upper semiconductor layer 26U_3 may be spaced apart from each other in the third direction D3, and the fourth lower semiconductor layer 26L_4 and the fourth upper semiconductor layer 26U_4 may be spaced apart from each other in the third direction D3. The stacked transistor structure ST may further include a fifth contact 32_5, a sixth contact 32_6, an eighth contact 32_8 and a second metal layer 24_2. The fifth contact 32_5 and the sixth contact 32_6 may contact the third lower semiconductor layer 26L_3 and the third upper semiconductor layer 26U_3, respectively, and the eighth contact 32_8 may contact both the fourth lower semiconductor layer 26L_4 and the fourth upper semiconductor layer 26U_4.

The second metal layer 24_2 may be provided between the third lower semiconductor layer 26L_3 and the fourth lower semiconductor layer 26L_4 and between the third upper semiconductor layer 26U_3 and the fourth upper semiconductor layer 26U_4. The second metal layer 24_2 may be spaced apart from the third lower semiconductor layer 26L_3, the fourth lower semiconductor layer 26L_4, the third upper semiconductor layer 26U_3 and the fourth upper semiconductor layer 26U_4 as illustrated in FIG. 1. A portion of the second lower thin semiconductor layer 22L_2 and a portion of the second upper thin semiconductor layer 22U_2 may be in the second metal layer 24_2 as illustrated in FIGS. 1 and 4. The second metal layer 24_2 may be a layer of a gate electrode. Although not shown, an insulating layer (i.e., a gate insulating layer) may be provided between the portion of the second lower thin semiconductor layer 22L_2 and the second metal layer 24_2 and between the portion of the second upper thin semiconductor layer 22U_2 and the second metal layer 24_2.

In some embodiments, a first upper surface US1 of the first upper thin semiconductor layer 22U_1 may be coplanar with a second upper surface US 2 of the second upper thin semiconductor layer 22U_2, and the first upper thin semiconductor layer 22U_1 and the second upper thin semiconductor layer 22U_2 may have an equal thickness in the third direction D3 as illustrated in FIG. 4. In some embodiments, a third upper surface US3 of the first lower thin semiconductor layer 22L_1 may be coplanar with a fourth upper surface US4 of the second lower thin semiconductor layer 22L_2, and the first lower thin semiconductor layer 22L_1 and the second lower thin semiconductor layer 22L_2 may have an equal thickness in the third direction D3 as illustrated in FIG. 4.

In FIG. 4, the first upper semiconductor layer 26U_1, the first lower semiconductor layer 26L_1, the third upper semiconductor layer 26U_3, the third lower semiconductor layer 26L_3 are represented by dotted boxes to show spatial relationships of those with other elements. In some embodiments, each of the first upper semiconductor layer 26U_1, the first lower semiconductor layer 26L_1, the third upper semiconductor layer 26U_3, and the third lower semiconductor layer 26L_3 may overlap the entirety of a corresponding thin semiconductor layer in the first direction D1 as illustrated in FIG. 4. For example, the first upper semiconductor layer 26U_1 may overlap the entirety of the first upper thin semiconductor layer 22U_1. As used herein, "an element A overlapping an element B in a direction X" (or similar language) means that there is at least one line that extends in the direction X and intersects both the elements A and B.

Although each of the first metal layer 24_1 and the second metal layer 24_2 is illustrated in a single layer, the present invention is not limited thereto. In some embodiments, each of the first metal layer 24_1 and the second metal layer 24_2 may include multiple layers. Further, in some embodiments, a lower portion of each of the first metal layer 24_1 and the second metal layer 24_2 may include material(s) different from an upper portion of each of the first metal layer 24_1 and the second metal layer 24_2. Further, in some embodiments, an isolation layer may be provided between the lower portion and the upper portion of each of the first metal layer 24_1 and the second metal layer 24_2, and the lower portion may be electrically isolated from the upper portion.

The integrated circuit device 110 may further include first to eighth conductive vias 34_1, 34_2, 34_3, 34_4, 34_5, 34_6, 34_7 and 34_8 that may contact the first contact 32_1, the second contact 32_2, the first metal layer 24_1, the fourth contact 32_4, the fifth contact 32_5, the sixth contact 32_6, the second metal layer 24_2, the eighth contact 32_8, respectively. The first to eighth conductive vias 34_1, 34_2, 34_3, 34_4, 34_5, 34_6, 34_7 and 34_8 may be electrically connected to conductive wires 36, respectively. In some embodiments, the first to eighth conductive vias 34_1, 34_2, 34_3, 34_4, 34_5, 34_6, 34_7 and 34_8 may contact the conductive wires 36, respectively, as illustrated in FIGS. 2 and 3.

An interlayer insulating layer 42 may be provided on the substrate 10. Although the interlayer insulating layer 42 is illustrated as a single layer, the interlayer insulating layer 42 may include multiple layers stacked on the substrate 10. The diode structure DS and the stacked transistor structure ST may be provided in the interlayer insulating layer 42. The interlayer insulating layer 42 may include an insulating material (e.g., silicon oxide, silicon nitride, silicon oxynitride, silicon carbide and/or low-k material). The low k material may include, for example, fluorine-doped silicon dioxide, organosilicate glass, carbon-doped oxide, porous silicon dioxide, porous organosilicate glass, spin-on organic polymeric dielectrics, or spin-on silicon based polymeric dielectric.

The substrate 10 may include one or more semiconductor materials, for example, Si, Ge, SiGe, GaP, GaAs, SiC, SiGeC and/or InP. In some embodiments, the substrate 10 may be a bulk substrate (e.g., a bulk silicon substrate) or a semiconductor on insulator (SOI) substrate.

Each of the first lower thin semiconductor layer 22L_1, the first upper thin semiconductor layer 22U_1, the second lower thin semiconductor layer 22L_2 and the second upper thin semiconductor layer 22U_2 may include multiple thin semiconductor layers stacked in the third direction D3. For example, the first upper thin semiconductor layer 22U_1 may include two thin semiconductor layers as illustrated in FIGS. 4 and 5 but the present invention is not limited thereto. Each of the stacked thin semiconductor layers may be a nanosheet. The nanosheet may include semiconductor material(s) (e.g., silicon, germanium, silicon-germanium, and/or III-V semiconductor compound). For example, each of nanosheets may have a thickness in a range of, for example, from 1 nm to 100 nm in the third direction D3.

The first and second metal layers 24_1 and 24_2 may include a semiconductor layer (e.g., a poly silicon layer), a work function layer (e.g., TiC layer, TiAl layer, TiAlC layer or TiN layer) and/or a metal layer (e.g., a tungsten layer, an aluminum layer or a copper layer).

Each of the first to fourth lower semiconductor layers 26L_1, 26L_2, 26L_3 and 26L_4 and the first to fourth upper semiconductor layers 26U_1, 26U_2, 26U_3 and 26U_4 may include semiconductor material(s) (e.g., silicon, germanium, silicon-germanium) and may also include optionally dopants (e.g., B, P or As). In some embodiments, the first lower semiconductor layer 26L_1 and the first upper semiconductor layer 26U_1 may be a silicon layer (e.g., an amorphous silicon layer).

The first contact 32_1, the second contact 32_2, the fourth contact 32_4, the fifth contact 34_5, the sixth contact 32_6, the eighth contact 32_8, the first to eighth conductive vias 34_1, 34_2, 34_3, 34_4, 34_5, 34_6, 34_7 and 34_8, and the conductive wires 36 may include a metal layer (e.g., a ruthenium layer, a molybdenum layer, a copper layer, a cobalt layer, an aluminum layer and/or a tungsten layer) and/or a metal nitride layer (e.g., a titanium nitride layer and/or a tantalum nitride layer).

Figure 6:
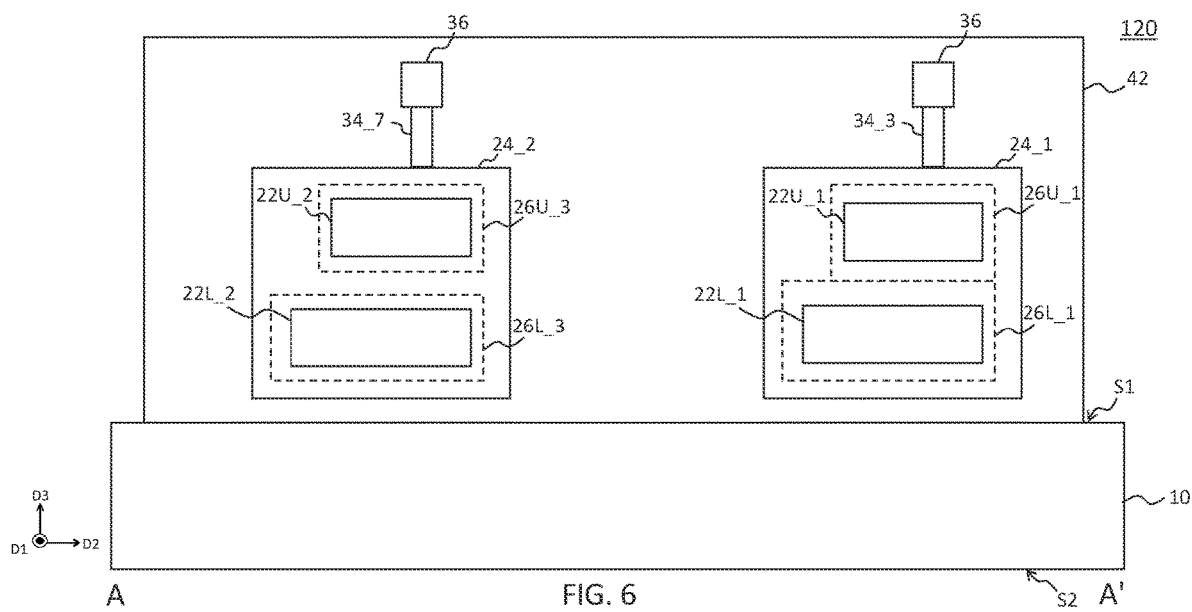
FIGS. 6 and 7 are cross-sectional views of an integrated circuit device taken along the line A-A' and the line B-B' in FIG. 1, respectively, according to some embodiments of the present invention.
Figure 7:
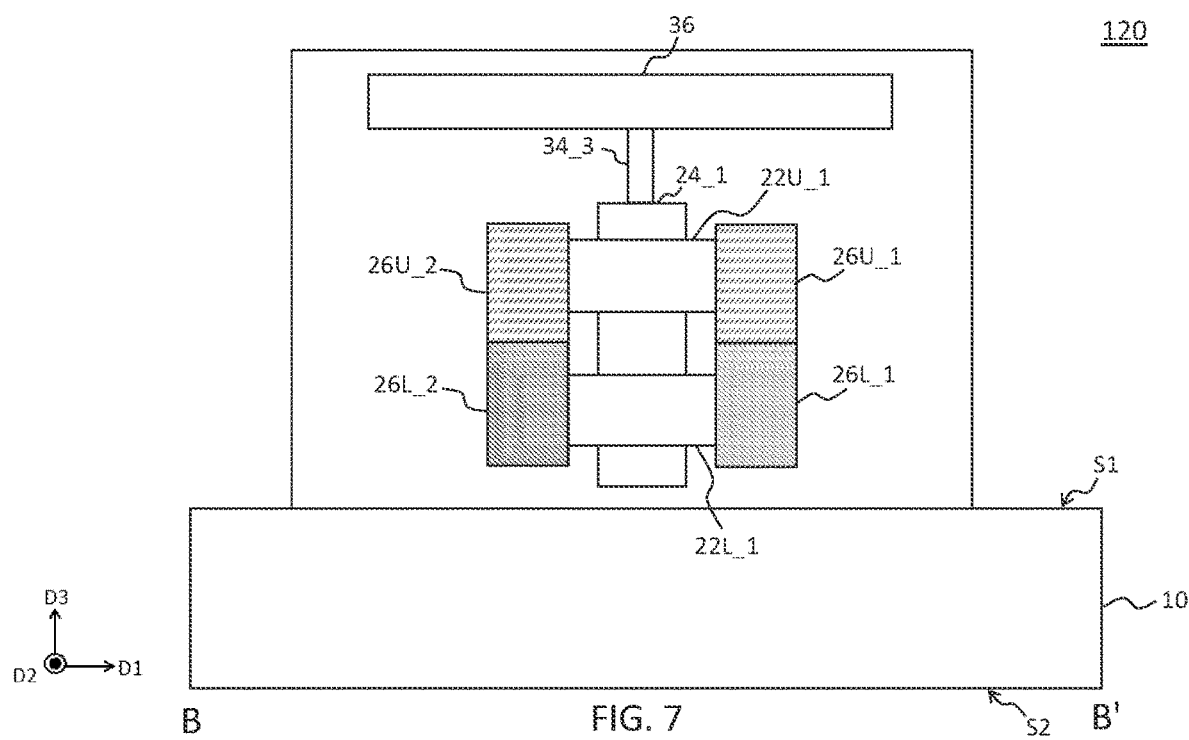

FIGS. 6 and 7 are cross-sectional views of an integrated circuit device 120 taken along the line A-A' and the line B-B' in FIG. 1, respectively, according to some embodiments of the present invention. The integrated circuit device 120 may be similar to the integrated circuit device 110 with a primary difference being that each of the first lower thin semiconductor layer 22L_1, the first upper thin semiconductor layer 22U_1, the second lower thin semiconductor layer 22L_2, the second upper thin semiconductor layer 22U_2 is a single layer (e.g., a single nanosheet).

Figure 8:
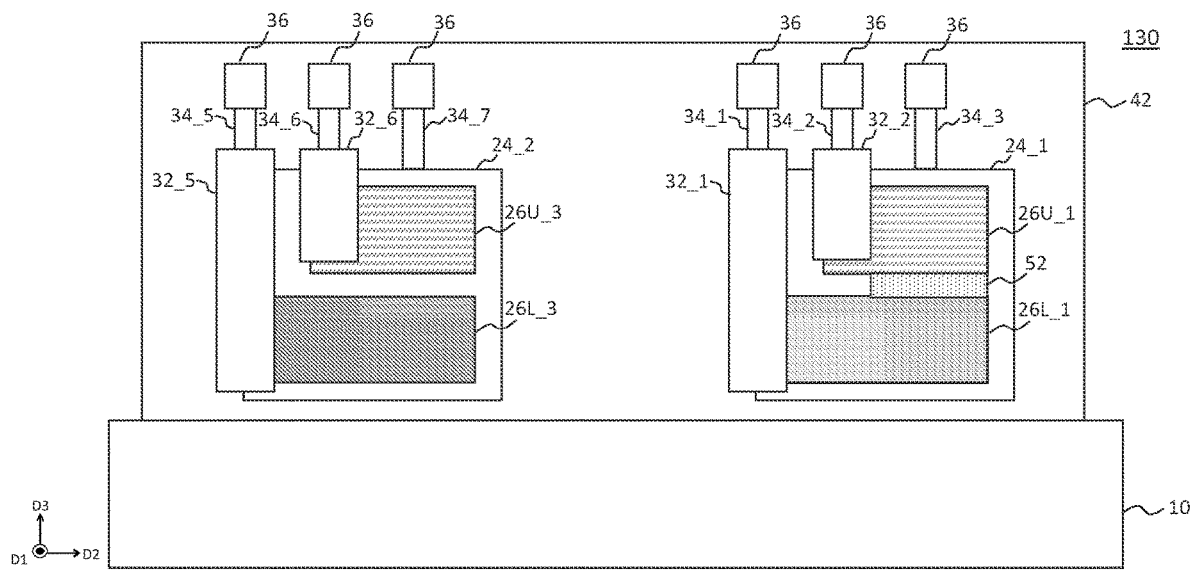
FIGS. 8 and 9 are side views of an integrated circuit device from viewpoints V and W in FIG. 1, respectively, according to some embodiments of the present invention.
Figure 9:
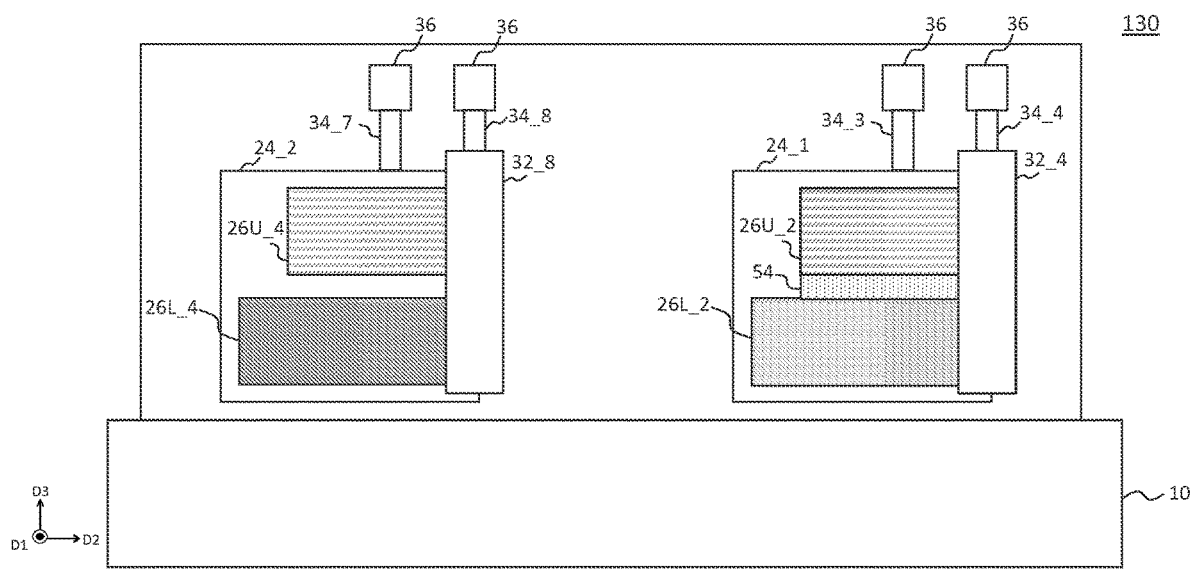

FIGS. 8 and 9 are side views of an integrated circuit device 130 from viewpoints V and W in FIG. 1, respectively, according to some embodiments of the present invention. The integrated circuit device 130 may be similar to the integrated circuit device 110 with a primary difference being that a first intrinsic semiconductor layer 52 is provided between the first lower semiconductor layer 26L_1 and the first upper semiconductor layer 26U_1 and contacts both the first lower semiconductor layer 26L_1 and the first upper semiconductor layer 26U_1. The first lower semiconductor layer 26L_1, the first intrinsic semiconductor layer 52 and the first upper semiconductor layer 26U_1 may collectively form a single diode. In some embodiments, the integrated circuit device 130 may also include a second intrinsic semiconductor layer 54 that may be provided between the second lower semiconductor layer 26L_2 and the second upper semiconductor layer 26U_2 and contacts both the second lower semiconductor layer 26L_2 and the second upper semiconductor layer 26U_2.

The first intrinsic semiconductor layer 52 and the second intrinsic semiconductor layer 54 may include silicon and/or silicon germanium and may have a thickness in a range of 10 nm to 200 nm in the third direction D3.

Figure 10:
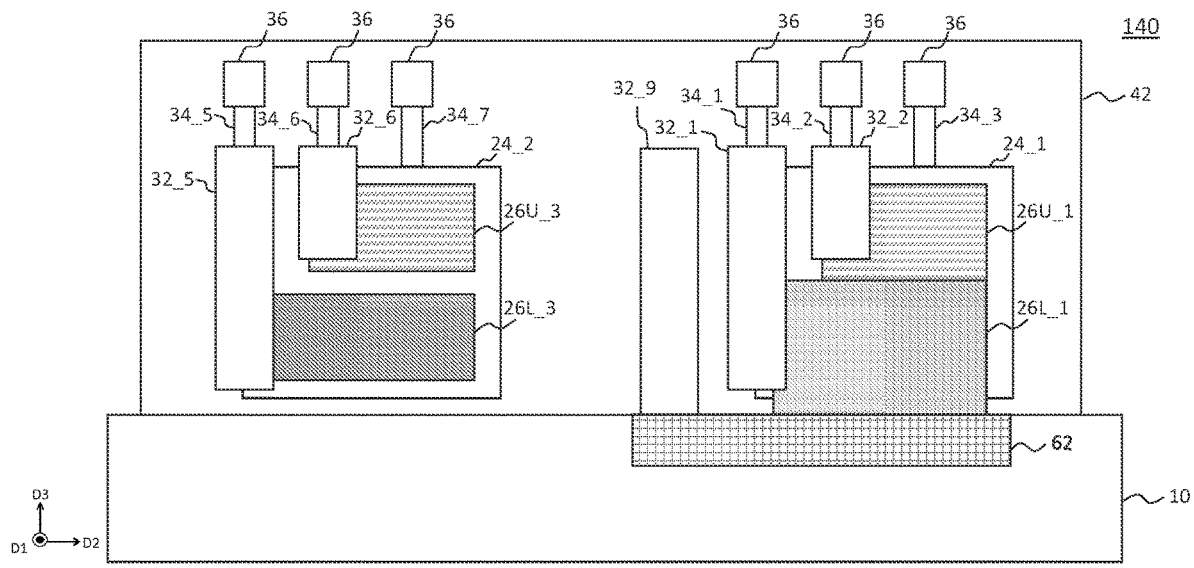
FIGS. 10 and 11 are side views of an integrated circuit device from viewpoints V and W in FIG. 1, respectively, according to some embodiments of the present invention.
Figure 11:
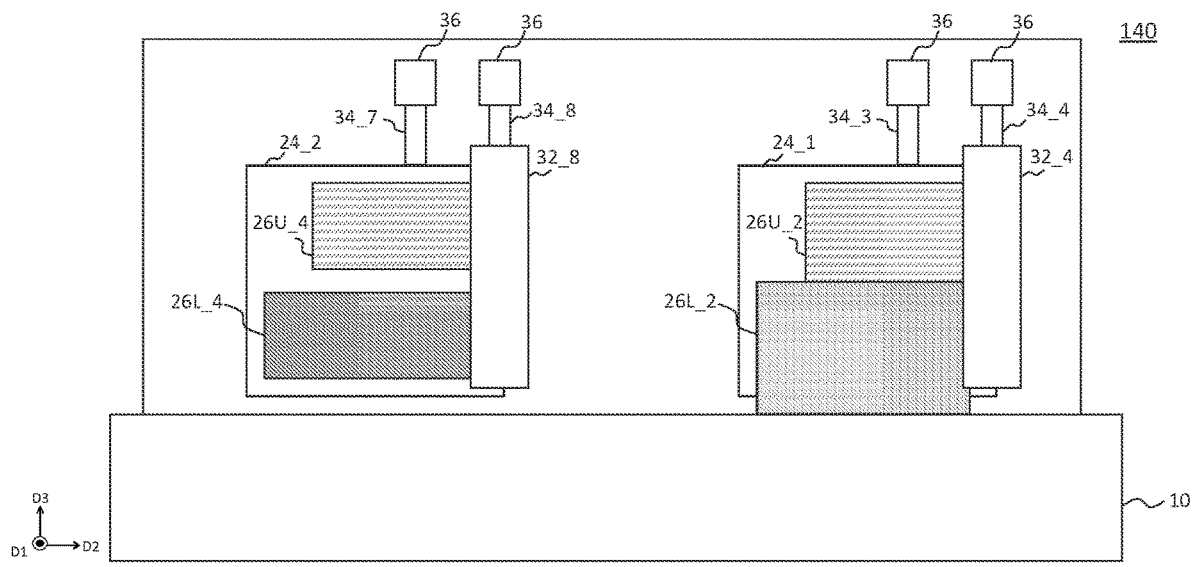

FIGS. 10 and 11 are side views of an integrated circuit device 140 from viewpoints V and W in FIG. 1, respectively, according to some embodiments of the present invention. The integrated circuit device 140 may be similar to the integrated circuit device 110 with primary differences being that the first lower semiconductor layer 26L_1 contacts a first portion 62 of the substrate 10. The first lower semiconductor layer 26L_1 and the first portion 62 of the substrate 10 may form a single diode. The first portion 62 of the substrate 10 may have the second conductivity type. A ninth contact 32_9 may be provided in the interlayer insulating layer 42 and may contact the first portion 62 of the substrate 10. The first contact 32_1 and the ninth contact 32_9 may be a first diode contact and a second diode contact, respectively.

The first portion 62 of the substrate 10 may include dopants at a concentration in a range of $10^{13}$ cm$^{-3}$ to $10^{20}$ cm$^{-3}$. The first portion 62 of the substrate 10 may have a thickness in a range of about 10 nm to about 400 nm (e.g., about 100 nm to about 200 nm) in the third direction D3. The ninth contact 32_9 may include a metal layer (e.g., a ruthenium layer, a molybdenum layer, a copper layer, a cobalt layer, an aluminum layer and/or a tungsten layer) and/or a metal nitride layer (e.g., a titanium nitride layer and/or a tantalum nitride layer).

Although FIG. 10 illustrates that the first upper semiconductor layer 26U_1 contacts the first lower semiconductor layer 26L_1, in some embodiments, the first upper semiconductor layer 26U_1 may be spaced apart from the first lower semiconductor layer 26L_1 in the third direction D3. Further, in some embodiments, the second upper semiconductor layer 26U_2 may contact the second lower semiconductor layer 26L_2 as illustrated in FIG. 11 or the second upper semiconductor layer 26U_2 may be spaced apart from the second lower semiconductor layer 26L_2 in the third direction D3.

Figure 12:
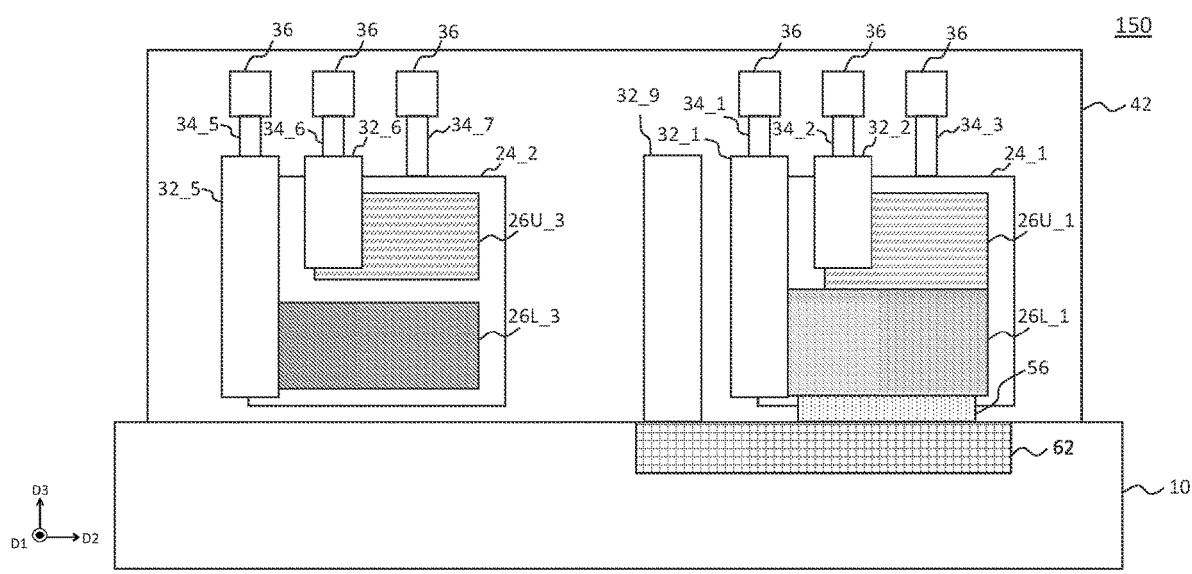
FIGS. 12, 13, 14, 15 and 16 are side views of an integrated circuit device from viewpoint V in FIG. 1 according to some embodiments of the present invention.

FIG. 12 is a side view of an integrated circuit device 150 from viewpoint V in FIG. 1 according to some embodiments of the present invention. The integrated circuit device 150 may be similar to the integrated circuit device 140 with primary differences being that a third intrinsic semiconductor layer 56 is provided between the first portion 62 of the substrate 10 and the first lower semiconductor layer 26L_1 and contacts both the first portion 62 of the substrate 10 and the first lower semiconductor layer 26L_1. The first lower semiconductor layer 26L_1, the third intrinsic semiconductor layer 56, and the first portion 62 of the substrate 10 may collectively form a single diode.

Figure 13:
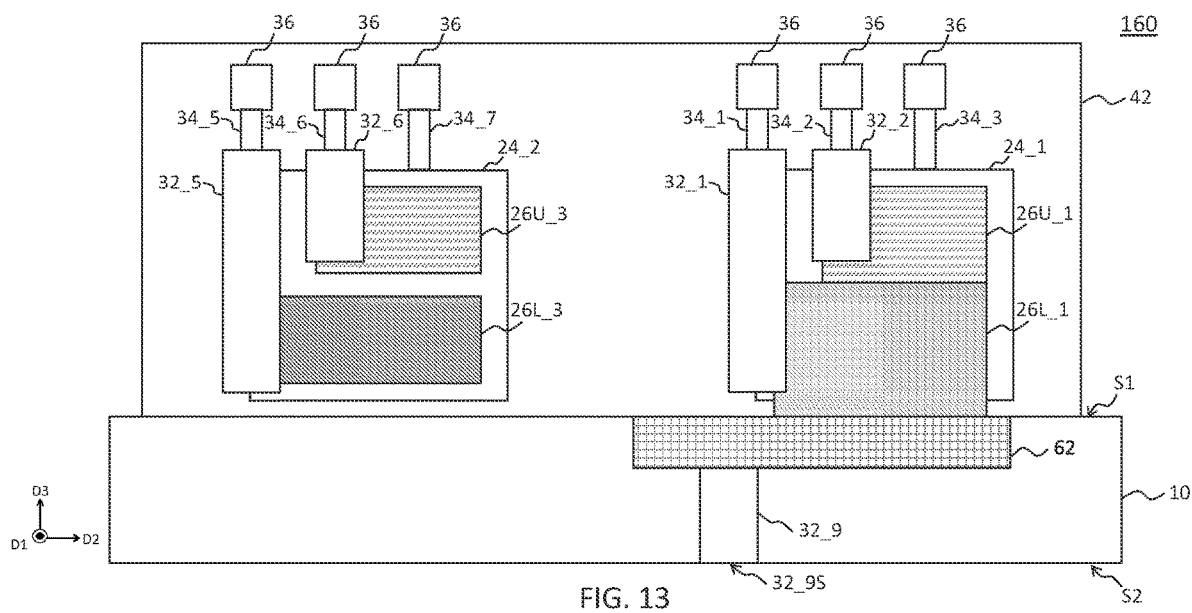

FIG. 13 is a side view of an integrated circuit device 160 from viewpoint V in FIG. 1 according to some embodiments of the present invention. The integrated circuit device 160 may be similar to the integrated circuit device 140 with a primary difference being that the ninth contact 32_9 is in the substrate 10. The ninth contact 32_9 includes a surface 32_9S that may be coplanar with the second surface S2 of the substrate 10 as illustrated in FIG. 13. In some embodiments, the surface 32_9S of the ninth contact 32_9 may protrude outwardly in the third direction D3 beyond the second surface S2 of the substrate 10 or may be recessed with respect to the second surface S2 of the substrate 10.

Figure 14:
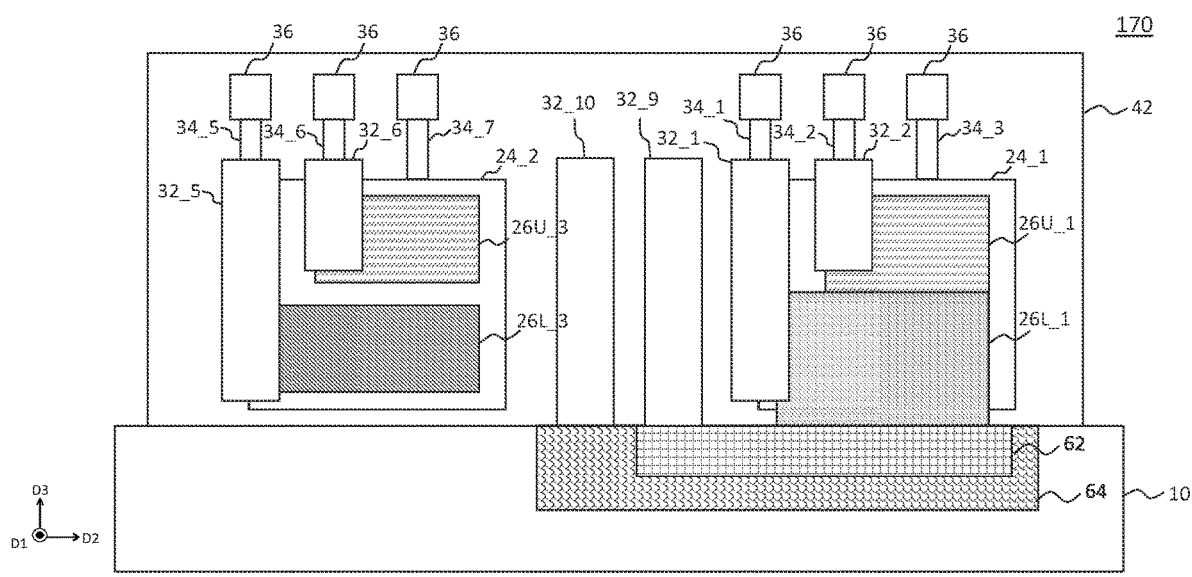

FIG. 14 is a side view of an integrated circuit device 170 from viewpoint V in FIG. 1 according to some embodiments of the present invention. The integrated circuit device 170 may be similar to the integrated circuit device 150 with primary differences being that a second portion 64 of the substrate 10 and a tenth contact 32_10 may be additionally provided. The second portion 64 of the substrate 10 may have a conductivity type (i.e., the first conductivity type) that is different from the first portion 62 of the substrate 10, and the first portion 62 and the second portion 64 of the substrate 10 may form a single diode. The ninth contact 32_9 and the tenth contact 32_10 may be a first diode contact and a second diode contact, respectively.

The second portion 64 of the substrate 10 may include dopants at a concentration in a range of $10^{13}$ cm$^{-3}$ to $10^{20}$ cm$^{-3}$. The second portion 64 of the substrate 10 may have a thickness in a range of about 10 nm to about 400 nm (e.g., about 100 nm to about 300 nm) in the third direction D3. The tenth contact 32_10 may include a metal layer (e.g., a ruthenium layer, a molybdenum layer, a copper layer, a cobalt layer, an aluminum layer and/or a tungsten layer) and/or a metal nitride layer (e.g., a titanium nitride layer and/or a tantalum nitride layer).

Figure 15:
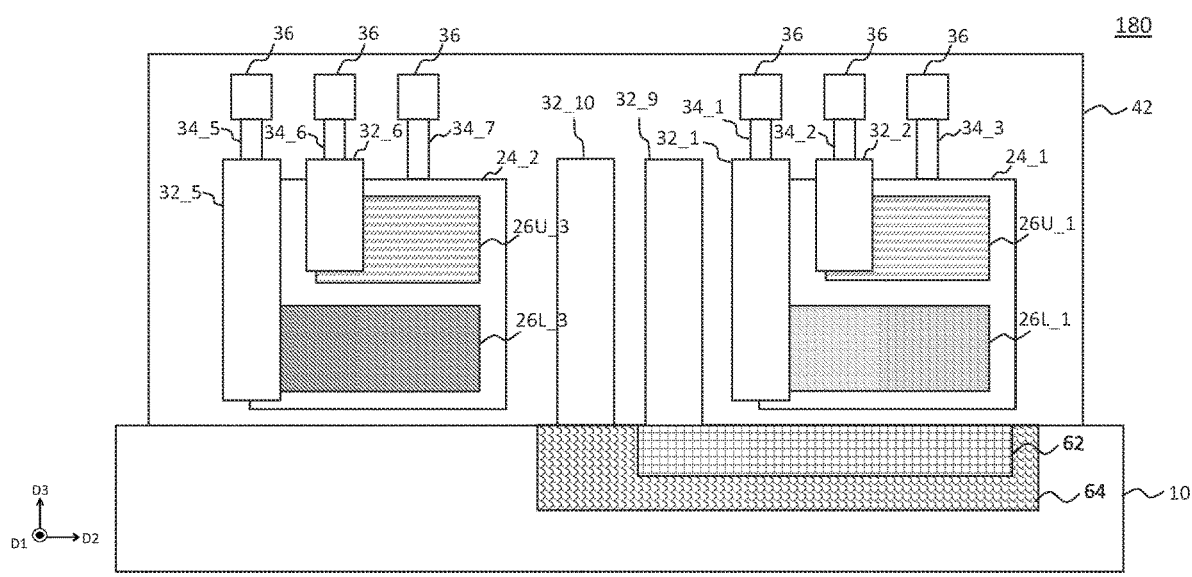

FIG. 15 is a side view of an integrated circuit device 180 from viewpoint V in FIG. 1 according to some embodiments of the present invention. The integrated circuit device 180 may be similar to the integrated circuit device 170 with primary differences being that the first lower semiconductor layer 26L_1 is spaced apart from the substrate 10 in the third direction D3 and the first upper semiconductor layer 26U_1 is spaced apart from the first lower semiconductor layer 26L_1 in the third direction D3.

Figure 16:
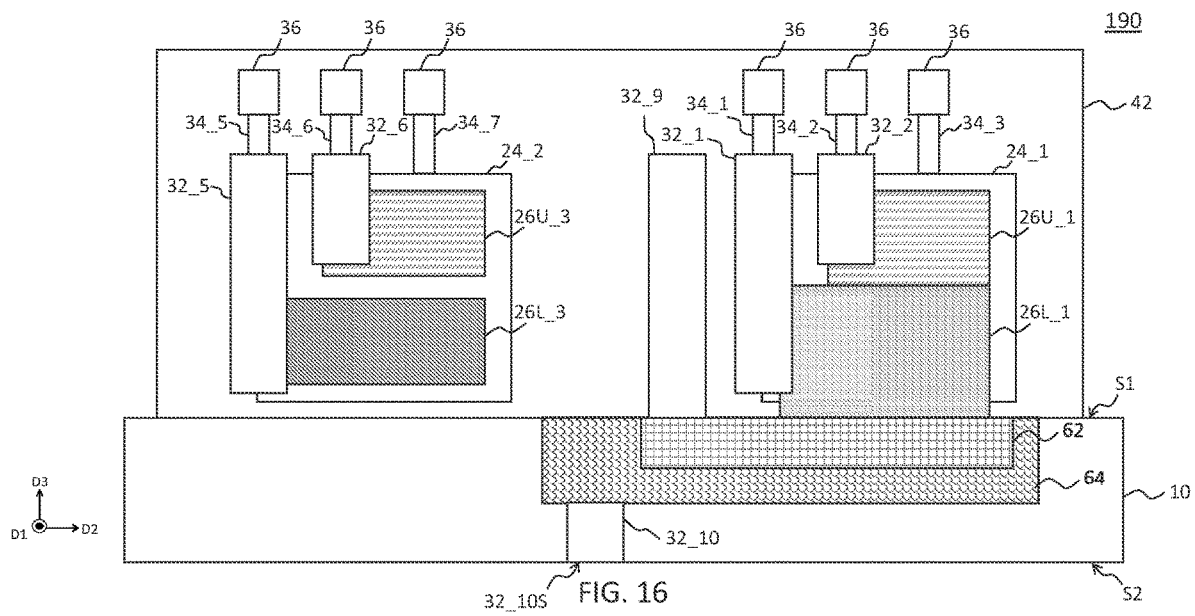

FIG. 16 is a side view of an integrated circuit device 190 from viewpoint V in FIG. 1 according to some embodiments of the present invention. The integrated circuit device 190 may be similar to the integrated circuit device 180 with a primary difference being that the tenth contact 32_10 is in the substrate 10. The tenth contact 32_10 includes a surface 32_10S that may be coplanar with the second surface S2 of the substrate 10 as illustrated in FIG. 16. In some embodiments, the surface 32_10S of the tenth contact 32_10 may protrude outwardly in the third direction D3 beyond the second surface S2 of the substrate 10 or may be recessed with respect to the second surface S2 of the substrate 10.

Figure 17:
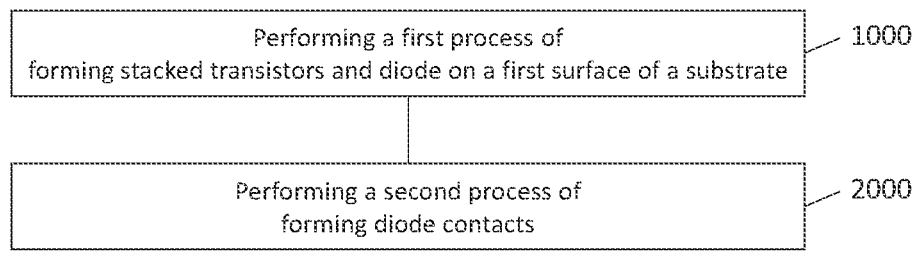
FIGS. 17 and 18 are flow charts of methods of forming an integrated circuit device according to some embodiments of the present invention.
Figure 18:
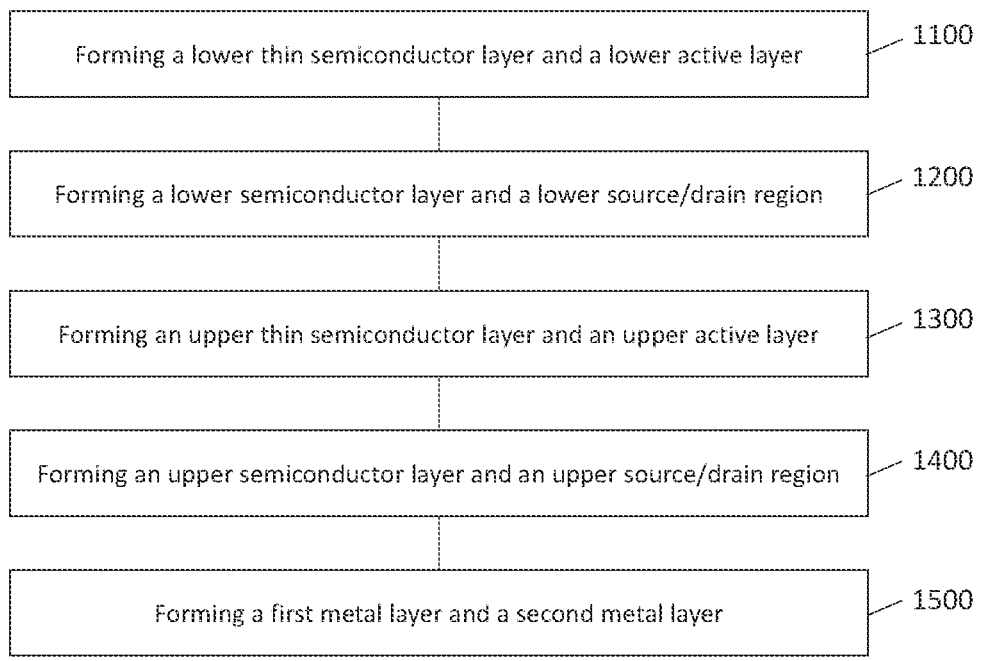
Figure 19:
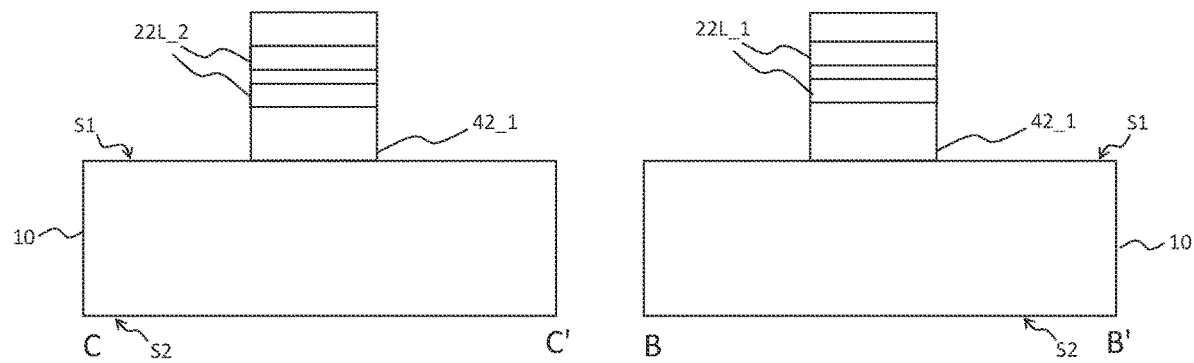
FIGS. 19, 20 and 21 are cross-sectional views taken along the line B-B' and the line C-C' in FIG. 1 illustrating methods of forming an integrated circuit device according to some embodiments of the present invention.
Figure 20:
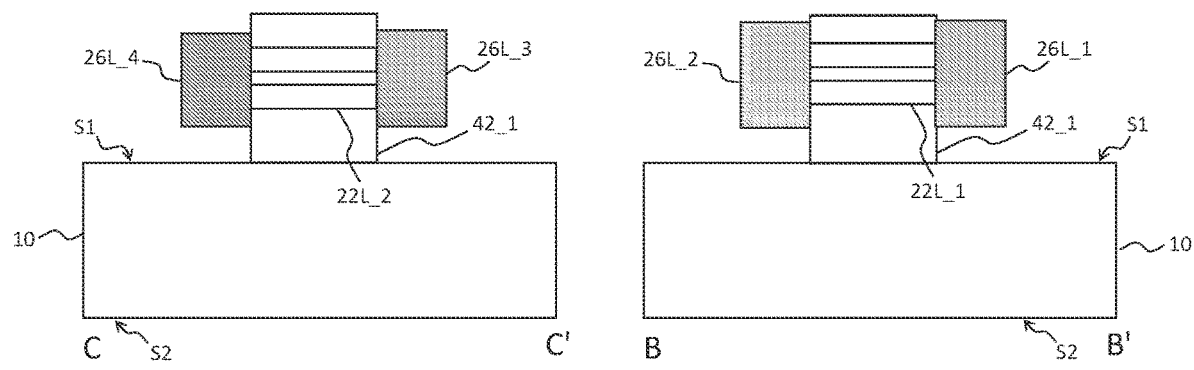
Figure 21:
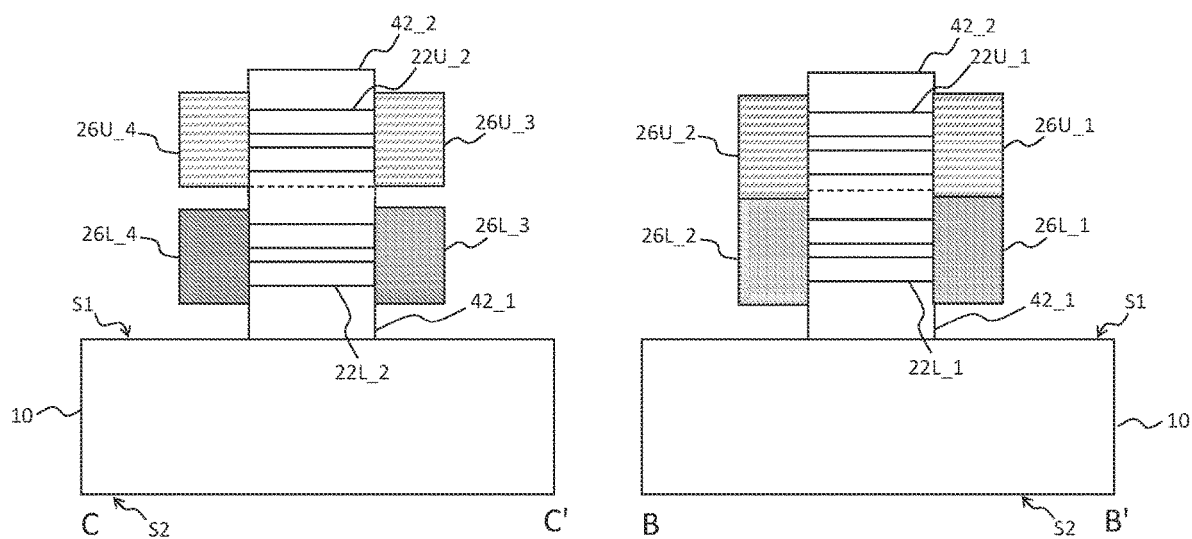

FIGS. 17 and 18 are flow charts of methods of forming an integrated circuit device according to some embodiments of the present invention. FIGS. 19-21 are cross-sectional views taken along the line B-B' and the line C-C' in FIG. 1 illustrating methods of forming an integrated circuit device according to some embodiments of the present invention. Referring to FIG. 17, the methods may include performing a first process of forming stacked transistors and a diode on a first surface of a substrate (Block 1000) and performing a second process of forming diode contacts (Block 2000).

Referring to FIGS. 18 and 19, the first process of forming stacked transistors and a diode may include forming a lower thin semiconductor layer 22L_1 and a lower active layer 22L_2 on a substrate 10 (Block 1100). In some embodiments, the lower thin semiconductor layer 22L_1 and the lower active layer 22L_2 may be formed concurrently at the same height from the first surface S1 of the substrate 10. For example, a preliminary lower semiconductor layer may be formed on the substrate 10 and then the preliminary lower semiconductor layer may be patterned, thereby forming the lower thin semiconductor layer 22L_1 and the lower active layer 22L_2. The lower thin semiconductor layer 22L_1 and the lower active layer 22L_2 may be portions of the single preliminary lower semiconductor layer. A first interlayer insulating layer 42_1 may be formed on the lower thin semiconductor layer 22L_1 and the lower active layer 22L_2 and may expose opposing side surfaces of the lower thin semiconductor layer 22L_1 and the lower active layer 22L_2.

Referring to FIGS. 18 and 20, a lower semiconductor layer (e.g., first and second lower semiconductor layers 26L_1 and 26L_2) and a lower source/drain region (e.g., third and fourth lower source/drain regions 26L_3 and 26L_4) may be formed (Block 1200). In some embodiments, the first and second lower semiconductor layers 26L_1 and 26L_2 may be formed by an epitaxial growth process using the lower thin semiconductor layer 22L_1 as a seed layer, and the third and fourth lower source/drain regions 26L_3 and 26L_4 may be formed by an epitaxial growth process using the lower active layer 22L_2 as a seed layer. In some embodiments, the first and second lower semiconductor layers 26L_1 and 26L_2 and the third and fourth lower source/drain regions 26L_3 and 26L_4 may be formed by a single epitaxial growth process.

Opposing side surfaces of the lower thin semiconductor layer 22L_1 may contact the first and second lower semiconductor layers 26L_1 and 26L_2, respectively, and opposing side surfaces of the lower active layer 22L_2 may contact the third and fourth lower source/drain regions 26L_3 and 26L_4, respectively, as illustrated in FIG. 20.

Referring to FIGS. 18 and 21, an upper thin semiconductor layer 22U_1 and an upper active layer 22U_2 may be formed on the lower thin semiconductor layer 22L_1 and the lower active layer 22L_2, respectively (Block 1300). A second interlayer insulating layer 42_2 may be formed on the upper thin semiconductor layer 22U_1 and the upper active layer 22U_2 and may expose opposing side surfaces of the upper thin semiconductor layer 22U_1 and the upper active layer 22U_2.

An upper semiconductor layer (e.g., first and second upper semiconductor layers 26U_1 and 26U_2) and an upper source/drain region (e.g., third and fourth source/drain regions 26U_3 and 26U_4) may be formed (Block 1400). In some embodiments, the first and second upper semiconductor layers 26U_1 and 26U_2 may be formed by an epitaxial growth process using the upper thin semiconductor layer 22U_1 as a seed layer, and the third and fourth source/drain regions 26U_3 and 26U_4 may be formed by an epitaxial growth process using the upper active layer 22U_2 as a seed layer. In some embodiments, the first and second upper semiconductor layers 26U_1 and 26U_2 and the third and fourth source/drain regions 26U_3 and 26U_4 may be formed by a single epitaxial growth process.

Referring to FIGS. 1 to 3 and 18, the first and second interlayer insulating layers 42_1 and 42_2 may be removed and a first metal layer 24_1 and a second metal layer 24_2 may be formed (Block 1500).

Figure 22:
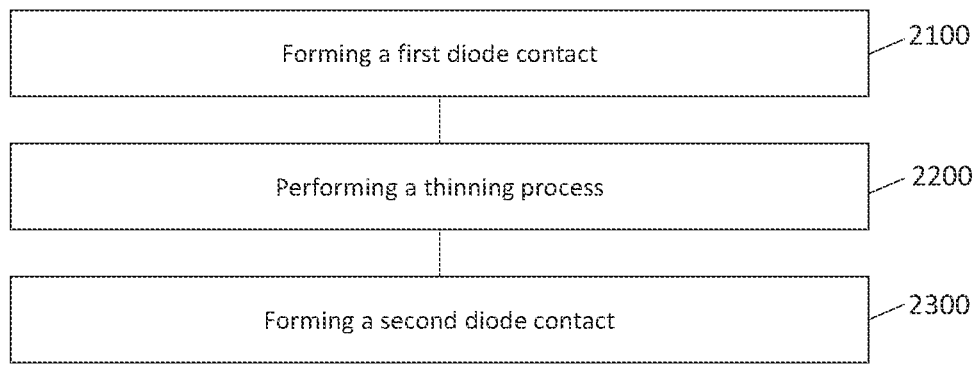
FIG. 22 is a flow chart of a process of forming diode contacts according to some embodiments of the present invention.
Figure 23:
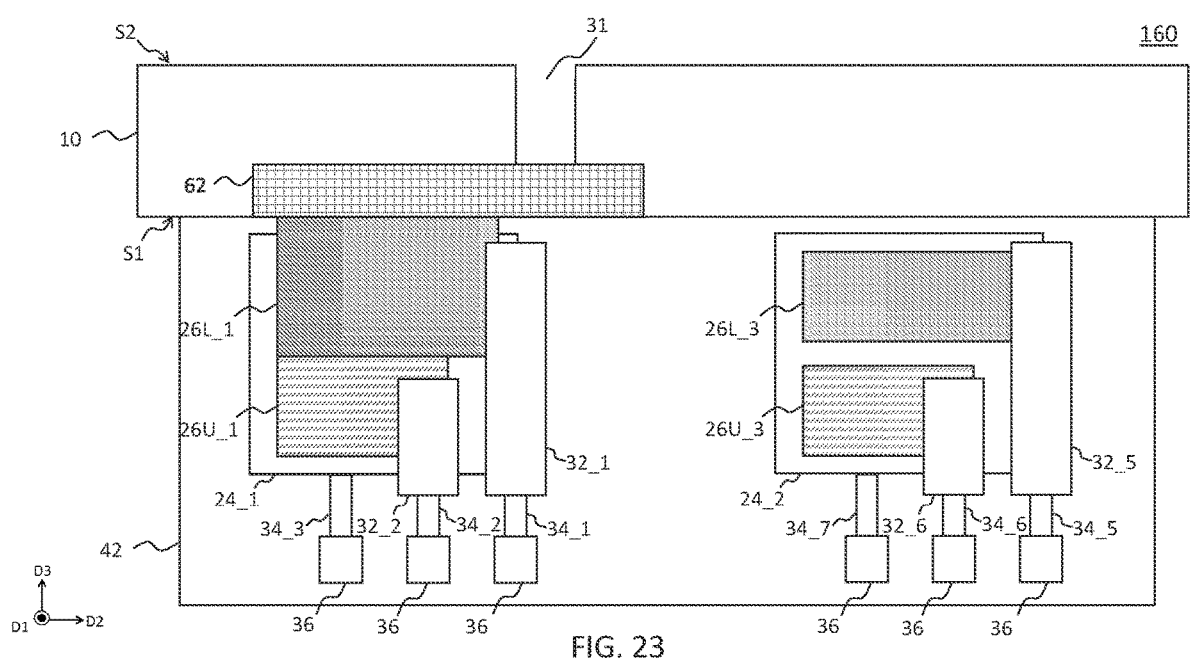
FIG. 23 is a cross-sectional view illustrating a process of forming diode contacts according to some embodiments of the present invention.

FIG. 22 is a flow chart of the second process of forming diode contacts according to some embodiments of the present invention, and FIG. 23 is a cross-sectional view illustrating the second process. Referring to FIG. 22, the second process may include forming a first diode contact (e.g., the first contact 32_1 in FIG. 13 or the ninth contact 32_9 in FIG. 16) (Block 2100), and then performing a thinning process on the second surface S2 of the substrate 10 (Block 2200). The thinning process may include an etch process (e.g., a dry etch process and/or a wet etch process) and/or a grinding process.

Referring to FIG. 22, a second diode contact (e.g., the ninth contact 32_9 in FIG. 13 or the tenth contact 32_10 in FIG. 16) may be formed in the substrate 10 (Block 2300). Referring to FIG. 23, the second diode contact may be formed by etching the second surface S2 of the substrate 10 to form an opening 31 and then forming the second diode contact in the opening 31.

In some embodiments, the second process of forming diode contacts according to some embodiments of the present invention may not include a thinning process (Block 2200 in FIG. 22), and both the first diode contact (e.g., the first contact 32_1 in FIGS. 2 and 10 or the ninth contact 32_9 in FIG. 14) and the second diode contact (e.g., the second contact 32_2 in FIG. 2, the ninth contact 32_9 in FIG. 10 or the tenth contact 32_10 in FIG. 14) may be formed on the first surface S1 (e.g., a front side) of the substrate 10 after the first metal layer 24_1 and the second metal layer 24_2 are formed.

Example embodiments are described herein with reference to the accompanying drawings. Many different forms and embodiments are possible without deviating from the scope of the present invention. Accordingly, the present invention should not be construed as limited to the example embodiments set forth herein. Rather, these example embodiments are provided so that this disclosure will be thorough and complete and will convey the scope of the present invention to those skilled in the art. In the drawings, the sizes and relative sizes of layers and regions may be exaggerated for clarity. Like reference numbers refer to like elements throughout.

Example embodiments of the present invention are described herein with reference to cross-sectional views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present invention should not be construed as limited to the particular shapes illustrated herein but include deviations in shapes that result, for example, from manufacturing, unless the context clearly indicates otherwise.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the scope of the present invention.

The above-disclosed subject matter is to be considered illustrative, and not restrictive, and the appended claims are intended to cover all such modifications, enhancements, and other embodiments, which fall within the scope of the invention. Thus, to the maximum extent allowed by law, the scope is to be determined by the broadest permissible interpretation of the following claims and their equivalents and shall not be restricted or limited by the foregoing detailed description.

What is claimed is:

1. A diode structure comprising:
    a substrate;
    an upper semiconductor layer on the substrate, wherein the upper semiconductor layer is spaced apart from the substrate in a vertical direction;
    an upper thin semiconductor layer protruding from a side surface of the upper semiconductor layer in a first horizontal direction;
    a lower semiconductor layer that is between the substrate and the upper semiconductor layer and has a first conductivity type;
    a lower thin semiconductor layer protruding from a side surface of the lower semiconductor layer in the first horizontal direction;
    a first diode contact that is electrically connected to the lower semiconductor layer; and
    a second diode contact that is electrically connected to one of the upper semiconductor layer and a portion of the substrate, wherein the one of the upper semiconductor layer and the portion of the substrate has a second conductivity type.

2. The diode structure of claim 1, wherein the upper semiconductor layer is electrically connected to the second diode contact and contacts the lower semiconductor layer.

3. The diode structure of claim 1, wherein the upper semiconductor layer is electrically connected to the second diode contact, and
    the diode structure further comprises an intrinsic semiconductor layer that is between the lower semiconductor layer and the upper semiconductor layer and contacts both the lower semiconductor layer and the upper semiconductor layer.

4. The diode structure of claim 1, wherein the portion of the substrate is electrically connected to the second diode contact and contacts the portion of the substrate.

5. The diode structure of claim 1, wherein the portion of the substrate is electrically connected to the second diode contact, and
    the diode structure further comprises an intrinsic semiconductor layer that is between the portion of the substrate and the lower semiconductor layer and contacts both the portion of the substrate and the lower semiconductor layer.

6. The diode structure of claim 1, further comprising an insulating layer on the substrate, wherein the lower semiconductor layer and the first diode contact are in the insulating layer, and the second diode contact is in the insulating layer or in the substrate.

7. The diode structure of claim 1, wherein one of the lower thin semiconductor layer and the upper thin semiconductor layer comprises a plurality of thin semiconductor layers that are stacked in the vertical direction, and the plurality of thin semiconductor layers protrude from the side surface of the lower semiconductor layer or the upper semiconductor layer in the first horizontal direction.

8. The diode structure of claim 1, wherein the lower semiconductor layer is a first lower semiconductor layer, and the upper semiconductor layer is a first upper semiconductor layer,
   the diode structure further comprises a second upper semiconductor layer and a second lower semiconductor layer that is between the substrate and the second upper semiconductor layer,
   the lower thin semiconductor layer contacts both a side surface of the first lower semiconductor layer and a side surface of the second lower semiconductor layer, and
   the upper thin semiconductor layer contacts both a side surface of the first upper semiconductor layer and a side surface of the second upper semiconductor layer.

9. The diode structure of claim 1, further comprising a metal layer that is spaced apart from the upper semiconductor layer in the first horizontal direction,
   wherein a portion of the upper thin semiconductor layer is in the metal layer.

10. The diode structure of claim 1, wherein the upper semiconductor layer has the second conductivity type and is electrically connected to the second diode contact, and
   each of the lower semiconductor layer and the upper semiconductor layer is a silicon layer.

11. An integrated circuit device comprising:
   a substrate; and
   a diode structure comprising:
      an upper semiconductor layer on the substrate;
      an upper thin semiconductor layer protruding from the upper semiconductor layer;
      a lower semiconductor layer that is between the substrate and the upper semiconductor layer;
      a lower thin semiconductor layer protruding from the lower semiconductor layer;
      a first diode contact that is electrically connected to the lower semiconductor layer or a first portion of the substrate; and
      a second diode contact that is electrically connected to the upper semiconductor layer or a second portion of the substrate.

12. The integrated circuit device of claim 11 further comprising a stacked transistor structure comprising:
   an upper transistor comprising an upper active layer that is spaced apart from the substrate in a vertical direction; and
   a lower transistor between the substrate and the upper transistor, the lower transistor comprising a lower active layer,
   wherein the upper active layer and the upper thin semiconductor layer have an equal thickness in the vertical direction, and an uppermost surface of the upper active layer is coplanar with an uppermost surface of the upper thin semiconductor layer.

13. The integrated circuit device of claim 11, wherein the first diode contact is electrically connected to the lower semiconductor layer, and the lower semiconductor layer has a first conductivity type, and
   the second diode contact is electrically connected to the upper semiconductor layer, and the upper semiconductor layer has a second conductivity type.

14. The integrated circuit device of claim 11, wherein the first diode contact is electrically connected to lower semiconductor layer, and the lower semiconductor layer has a first conductivity type, and
   the second diode contact is electrically connected to the second portion of the substrate, and the second portion of the substrate has a second conductivity type.

15. The integrated circuit device of claim 11, wherein the first diode contact is electrically connected to the first portion of the substrate, and the first portion of the substrate has a first conductivity type, and
   the second diode contact is electrically connected to the second portion of the substrate, and the second portion of the substrate has a second conductivity type.

16. The integrated circuit device of claim 15, further comprising an insulating layer on the substrate,
   wherein the lower thin semiconductor layer and the first diode contact are in the insulating layer, and the second diode contact is in the substrate.

17. A method of forming an integrated circuit device, the method comprising:
   forming a lower thin semiconductor layer on a substrate;
   forming a lower semiconductor layer contacting a side surface of the lower thin semiconductor layer;
   forming an upper thin semiconductor layer;
   forming an upper semiconductor layer contacting a side surface of the upper thin semiconductor layer;
   forming a first diode contact that is electrically connected to the lower semiconductor layer or a first portion of the substrate; and
   forming a second diode contact that is electrically connected to the upper semiconductor layer or a second portion of the substrate.

18. The method of claim 17, further comprising forming an intrinsic semiconductor layer that is between the lower semiconductor layer and the upper semiconductor layer and contacts both the lower semiconductor layer and the upper semiconductor layer or is between the substrate and the lower semiconductor layer and contacts both the substrate and the lower semiconductor layer.

19. The method of claim 17, wherein the substrate comprises a first surface facing the lower thin semiconductor layer and a second surface that is opposite and parallel to the first surface of the substrate, and
   the first diode contact is formed by a process performed on the second surface of the substrate.

20. The method of claim 17, further comprising:
   forming a lower active layer on the substrate; and
   forming a lower source/drain region contacting a side surface of the lower active layer,
   wherein the lower active layer and the lower thin semiconductor layer are formed concurrently.

* * * * *